United States Patent
Grossi et al.

(10) Patent No.: US 8,963,220 B2
(45) Date of Patent: *Feb. 24, 2015

(54) SHALLOW TRENCH ISOLATION FOR A MEMORY

(71) Applicant: Micron Technology, Inc, Boise, ID (US)

(72) Inventors: Alessandro Grossi, Milan (IT); Marcello Mariani, Milan (IT); Paolo Cappelletti, Seveso (IT)

(73) Assignee: Micron Technology, Inc., Boise, ID (US)

( * ) Notice: Subject to any disclaimer, the term of this patent is extended or adjusted under 35 U.S.C. 154(b) by 42 days.

This patent is subject to a terminal disclaimer.

(21) Appl. No.: 14/043,704

(22) Filed: Oct. 1, 2013

(65) Prior Publication Data

US 2014/0027834 A1 Jan. 30, 2014

Related U.S. Application Data

(60) Continuation of application No. 13/315,337, filed on Dec. 9, 2011, which is a division of application No. 12/341,002, filed on Dec. 22, 2008, now Pat. No. 8,097,506.

(51) Int. Cl.
*H01L 29/76* (2006.01)
*H01L 29/788* (2006.01)
*H01L 27/115* (2006.01)
*H01L 29/423* (2006.01)

(52) U.S. Cl.
CPC ........ *H01L 29/788* (2013.01); *H01L 27/11521* (2013.01); *H01L 29/42324* (2013.01); *H01L 29/7881* (2013.01)
USPC .......................................... 257/288; 257/314

(58) Field of Classification Search
None
See application file for complete search history.

(56) References Cited

U.S. PATENT DOCUMENTS

| | | | |
|---|---|---|---|
| 6,512,282 B2 | 1/2003 | Esaki | |
| 6,579,761 B1 | 6/2003 | Hsieh | |
| 6,969,653 B2 | 11/2005 | Jwa | |
| 7,091,091 B2 | 8/2006 | Ding | |
| 7,432,157 B2 | 10/2008 | Kim | |
| 8,664,702 B2 * | 3/2014 | Grossi et al. | 257/288 |
| 2003/0224572 A1 | 12/2003 | Yang | |
| 2008/0061350 A1 | 3/2008 | Watanabe | |
| 2008/0217685 A1 | 9/2008 | Kim | |

OTHER PUBLICATIONS

U.S. Appl. No. 13/315,337, Grossi et al., filed Dec. 9, 2011.*

* cited by examiner

*Primary Examiner* — Scott B Geyer
(74) *Attorney, Agent, or Firm* — Dorsey & Whitney LLP

(57) ABSTRACT

In some embodiments, a gate structure with a spacer on its side may be used as a mask o form self-aligned trenches in microelectronic memory, such as a flash memory. A first portion of the gate structure may be used to form the mask, together with sidewall spacers, in some embodiments. Then, after forming the shallow trench isolations, a second portion of the gate structure may be added to form a mushroom shaped gate structure.

19 Claims, 2 Drawing Sheets

SHALLOW TRENCH ISOLATION FOR A MEMORY

CROSS-REFFRENCE TO RELATED APPLICATIONS

This application is a continuation of U.S. patent application Ser. No. 13/315,337 filed on Dec. 9, 2011, issued as U.S. Pat. No. 8,664,702 on Mar. 4, 2014, which is a divisional of U.S. patent application Ser. No. 12/341,002 filed on Dec. 22, 2008, issued as U.S. Pat. No. 8,097,506 on Jan. 17, 2012. These applications and patents are incorporated herein by reference in their entirety and for any purpose.

BACKGROUND

This relates generally to microelectronic memories.

Columns of flash memory cells in memory arrays may be isolated by shallow trench isolations. In the shallow trench isolation process, shallow trenches are formed between the columns using, as a mask, the polysilicon that will form the gate electrode. Ultimately, these trenches are filled with an insulator that isolates one column from its two adjacent neighbors.

DETAILED DESCRIPTION

In accordance with some embodiments, substrate active area corners, adjacent to shallow trench isolations, are made electrically inactive. By making these corners electrically inactive, reliability issues related to the corners may be reduced. For example, active area thinning or thickening, increased electric field in the corner region, or combinations of these may lead to accelerated degradation of the active oxide over these corners.

In accordance with one embodiment, a self-aligned, shallow trench isolation approach may be utilized. However, other approaches may be utilized as well. In the self-aligned shallow trench isolation approach, part of the floating gate is defined while etching the trench for shallow trench isolation. Then the rest of the floating gate polysilicon is deposited and patterned further on in the process flow using lithographic or damascene techniques.

Another approach that may be utilized, in accordance with some embodiments, is advanced self-aligned shallow trench isolation where the whole floating gate is defined while etching the trench during shallow trench isolation. Also, a pol- chemical mechanical planarization (poly-CMP) approach may be used. In poly-CMP, the floating gate is built by a damascene process. Then the shallow trench isolation nitride acts as a place holder and the field oxide is used as a stepping layer for damascene process.

In accordance with some embodiments, spacers are used around gate material that will ultimately form at least part of a gate electrode. The spacers on the gate material form an etching mask to space the resulting, etched shallow trench away from the ultimate gate electrode structure. This spacing forms electrically inactive active area corners at the substrate locations covered the spacers. Those spacers create an electrically inactive ledge region of the substrate active area to either side of the gate electrode. The ledges and the shallow trench isolation are self-aligned to the gate material.

Figure 1:
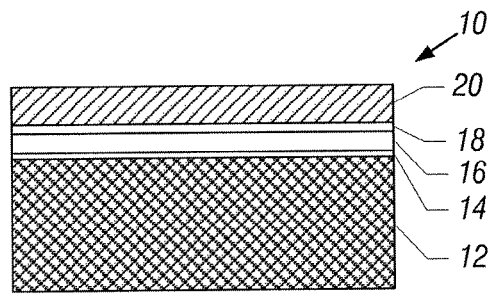
FIG. 1 is an enlarged, cross-sectional view at an early stage of manufacture.

Referring to FIG. 1, a bulk silicon microelectronic substrate 12 may be covered a tunnel dielectric 14, a lower gate layer 16, a dielectric layer 18, and a nitride layer 20 to form the structure 10. The tunnel dielectric 14 and the dielectric layer 18 may be formed by any suitable insulating material including oxide. The lower gate layer 16 may be doped or undoped polysilicon or other suitable conductive or non-conductive gate forming materials. In another embodiment, the substrate 12 may be formed of epitaxial material.

Figure 2:
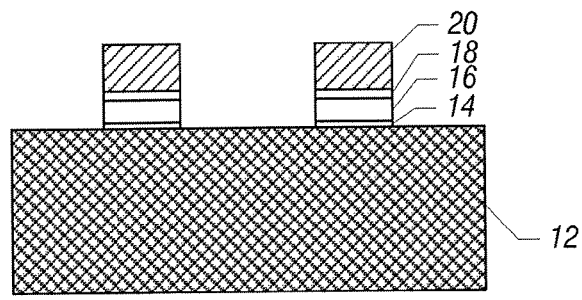
FIG. 2 is an enlarged, cross-sectional view at a stage subsequent to that shown in FIG. 1 in accordance with one embodiment.

As shown in FIG. 2, gate structures are then defined and etched to form strips. The individual gates are not separated at this point. In FIG. 2, two adjacent columns are shown, but many parallel columns may be provided. Each strip may include a nitride layer 20 over a dielectric layer 18, a lower gate layer 16, and a tunnel dielectric 14, situated on the microelectronic substrate 12.

In some embodiments, the layer 16 is the lower part of a two-part floating gate for a flash memory. However, the present invention is not limited to floating gates or two-part gates.

Figure 3:
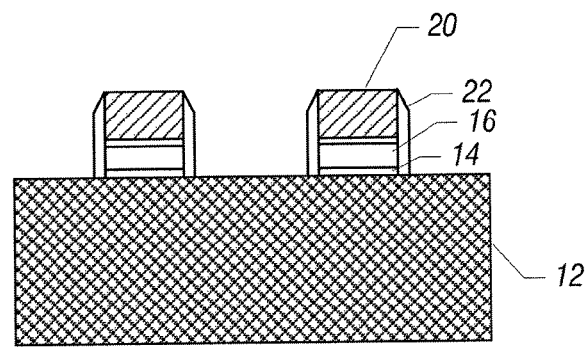
FIG. 3 is an enlarged, cross-sectional view at a stage subsequent to that shown in FIG. 2 in accordance with one embodiment.

Referring to FIG. 3, spacers 22 have been formed on the lower gate structures of FIG. 2. The spacers 22 may be sidewall spacers in one embodiment. However, overhanging spacers, such as an overhanging nitride spacer, may us another embodiment. The spacer 22 material an insulator, such as oxide, for example. In some embodiments, it is advantageous to use, as the spacer 22, a dielectric other than nitride and material other than the lower gate material; to facilitate subsequent nitride mask removal.

Spacers 22 may be formed by blanket depositing the spacer material. In one embodiment, this blanket deposited spacer structure is then anisotropically etched to form t spacers 22 shown in FIG. 3.

In some embodiments, unlike conventional sidewall spacers used for spacing source drain implants, the spacers 22 are arranged on the sides of gate structure that will not have a source or drain. That is, the spacers are aligned perpendicular to the direction through the subsequently formed source/drains.

Figure 4:
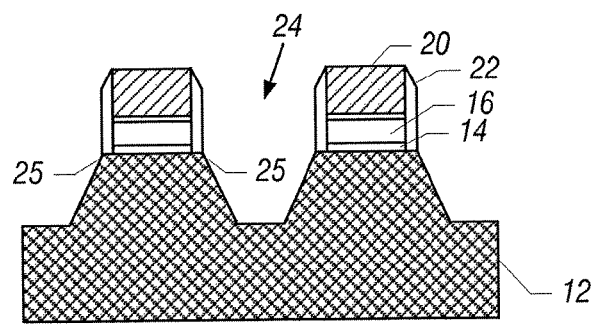
FIG. 4 is an enlarged, cross-sectional view at a stage subsequent to that shown in FIG. 3 in accordance with one embodiment.

Then, as shown in FIG. 4, the structure shown in FIG. 3 is used as a mask for shallow trench 24 isolation etching. The resulting shallow trenches 24 separate the strips and, ultimately, separate adjacent columns of cells from one another. The shallow trenches 24 are displaced outwardly of the gate stack by way of the spacers 22, forming the electrically inactive ledges 25 in the active area 34.

Figure 5:
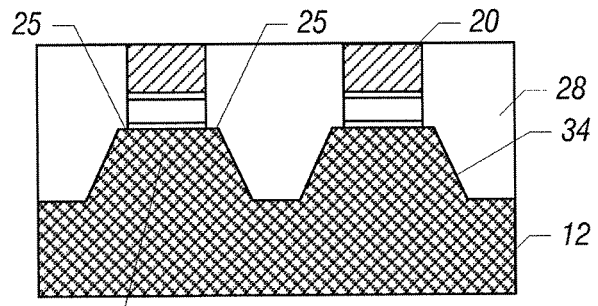
FIG. 5 is an enlarged, cross-sectional view at a stage subsequent to that in accordance with one embodiment.

Next, a sidewall ion may be performed, followed by gap filling and field ex chemical mechanical planarization to form the field oxide 28, as shown in FIG. 5. In some embodiments, the spacer (no longer shown) is left in place buried within the field oxide 28. In other embodiments, the spacer 22 is removed prior to gap filling and, in some cases, before sidewall oxidation. The sidewall oxidation oxidizes edges of the trench 24 sidewalls to recover etch damage, to protect the trench 24, and to round the corners of the active areas 34.

Figure 6:
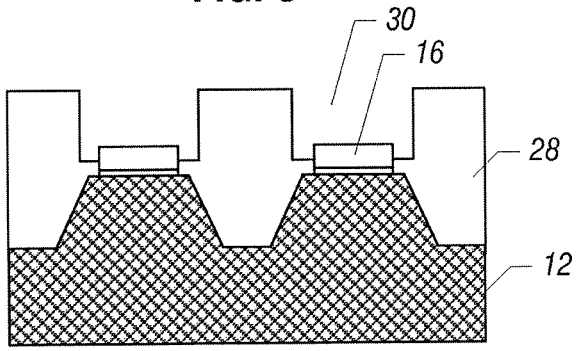
FIG. 6 is an enlarged, cross-sectional view at a subsequent stage.

An etch process, illustrated in FIG. 6, may remove the nitride layer 20, whose function is completed. A buffer oxide wet etch may be utilized. As a result, the layer 16 may be partially exposed, because the width of the resulting trench 30 may be wider than the width of the layer 16 in some embodiments. The trench 30 width may correspond to the width of the active area 34 defined between adjacent trenches 24.

Figure 7:
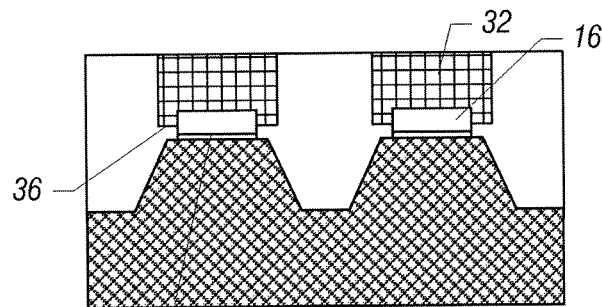
FIG. 7 is an enlarged, cross-sectional view at a subsequent stage.

Next, as shown in FIG. 7, an upper gate layer 32 may be deposited on the layer 16 and patterned to form a strip extending parallel to the shallow trenches 24. Note that the upper gate layer 32 extends over the sides of the lower gate layer 16, forming an overhanging or mushroom shaped gate structure, that may be a floating gate in some embodiments.

The dielectric 36 under the layer 32 is thicker than the tunnel dielectric 14 under the layer 16 in one embodiment. In some embodiments, the layer 16 may be undoped as deposited and the layer 32 may be doped as deposited. Subsequent thermal treatments may dope the layer 16 via diffusion from the layer 32.

Figure 8:
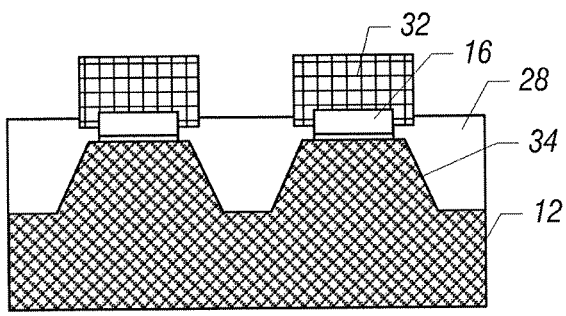
FIG. 8 is an enlarged, cross-sectional view at a subsequent stage.

Finally, the field oxide 28 may be subjected to recession down to a level slightly below the upper level of the lower gate layer 16, as shown in FIG. 8. This exposes the upper surface of the upper gate layer 32, but not its lower surface, avoiding etch-related damage to the tunnel electric.

The rest of the process can proceed conventionally, including formation of interpoly dielectric, control gates, and sources and drains in the column direction (into the page) in the active areas 34.

In some embodiments, it is advantageous to form the shallow trenches 24 prior to forming a mushroom shaped floating gate. The techniques described herein are applicable to both NOR and NAND flash memories, as well as other microelectronic memories.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed:

1. An apparatus comprising:
a substrate including two parallel trenches in the substrate defining an active area between the trenches; and
a floating gate structure in the active area, the active area including an unetched portion of the substrate between a trench and an edge of the floating gate structure, wherein the unetched portion of the substrate is electrically inactive, and wherein the floating gate structure includes a first dielectric layer disposed between the active area and a lower gate layer, and further includes an upper gate layer disposed on the lower gate layer.

2. The apparatus of claim 1, wherein the lower and upper gate layers are polysilicon.

3. The apparatus of claim 1, wherein the floating gate structure comprises a floating gate memory.

4. The apparatus of claim 1 wherein the two parallel trenches are self-aligned to the floating gate structure at an outward displacement.

5. An apparatus comprising;
a substrate including two parallel trenches in the substrate defining an active area between the trenches;
a floating gate structure in the active area, the active area including an unetched portion of the substrate between a trench and an edge of the floating gate structure, and wherein the floating gate structure includes a first dielectric layer disposed between the active and a lower gate layer, and further includes and upper gate layer disposed on the lower gate layer; and
a spacer disposed on the edge of the floating gate structure and over the unetched portion of the substrate.

6. The apparatus of claim 5 wherein the trench is displaced outwardly of the gate stack by way of the spacer.

7. An apparatus comprising:
a substrate including two parallel isolation trenches in the substrate defining an active area between the isolation trenches; and
a gate structure in said active area, wherein said floating gate includes a first dielectric layer disposed between the active area and a first gate layer, and further includes a second gate layer, wherein the second gate layer extends over sides of the first gate layer.

8. The apparatus of claim 7, wherein the first and second gate layers are polysilicon.

9. The apparatus of claim 7, wherein the second gate layer overhangs the first gate layer.

10. The apparatus of claim 7 wherein the second gate layer of the gate structure is disposed in a trench, wherein the trench is wider than a width of the first gate layer.

11. The apparatus of claim 7 wherein the first gate layer comprises a floating gate and the first dielectric layer comprises a tunnel dielectric.

12. An apparatus comprising:
a substrate including two parallel trenches in said substrate;
a gate structure disposed between the trenches, wherein the gate structure has first and second parallel sides, wherein the first and second parallel sides of the gate struciure are parallel to the two parallel trenches;
a first spacer disposed on the first side of the gate structure; and
a second spacer disposed on the second side of said gate structure, wherein the trenches are self-aligned to the first and second spacers.

13. The apparatus of claim 12, further comprising an active area disposed between the trenches and wherein the first and second spacers are disposed over the active area.

14. The apparatus of claim 12, further comprising source/drain regions adjacent the gate structure and disposed laterally in as first direction of the gate structure, wherein the first and second spacers are aligned perpendicular to the first direction.

15. The apparatus of claim 12 wherein the trenches are displaced outwardly of the gate structure.

16. The apparatus of claim 12 wherein the first and second spacers are the same material.

17. An apparatus comprising:
a substrate including two parallel trenches in said substrate;
a gate structure disposed between the trenches, wherein the gate structure has first and second parallel sides;

a first spacer disposed on the first side of the gate structure;
a second spacer disposed on the second side of the said gate structure, wherein the trenches are self-aligned to the first and second spacers; and
an active area disposed between the trenches and wherein the first and second spacers are disposed on a portion of the active area that is electrically inactive.

18. An apparatus comprising;
a substrate including two parallel trenches in said substrate;
a gate structure disposed between the trenches, wherein the gate structure comprises a mushroom shaped gate structure and has first and second parallel sides;
a first spacer disposed on the first side of the gate structure; and
a second spacer dispose on the second side of said gate structure, wherein the trenches are self-aligned to the first and second spacers.

19. An apparatus comprising;
a substrate including two parallel trenches in said substrate;
a gate structure disposed between the trenches, wherein the gate structure includes:
 first and second parallel sides;
 a floating gate;
 a tunnel dielectic disposed between the subtrate and the floating gate; and
 an upper gate disposed over the floating gate;
a first spacer disposed on the first side of the gate structure; and
a second spacer dispose on the second side of said gate structure, wherein the trenches are self-aligned to the first and second spacers.

* * * * *